United States Patent [19]

Yamano et al.

[11] Patent Number: 5,236,802
[45] Date of Patent: Aug. 17, 1993

[54] LITHOGRAPHIC PRINTING PLATE WITH POLYACRYLAMIDE POLYMER IN PHYSICAL DEVELOPMENT NUCLEI LAYER

[75] Inventors: Motozo Yamano; Akio Yoshida, both of Tokyo, Japan

[73] Assignee: Mitsubishi Paper Mills Limited, Tokyo, Japan

[21] Appl. No.: 844,746

[22] Filed: Mar. 2, 1992

[30] Foreign Application Priority Data

Mar. 6, 1991 [JP] Japan .................................. 3-065546

[51] Int. Cl.$^5$ .............................. G03C 5/54; G03F 7/06
[52] U.S. Cl. .................................... 430/204; 430/229; 430/232; 430/227
[58] Field of Search ............... 430/204, 232, 230, 227, 430/206, 229

[56] References Cited

U.S. PATENT DOCUMENTS

| | | | |
|---|---|---|---|
| 3,681,073 | 8/1972 | Debruyn | 430/232 |
| 3,721,559 | 3/1973 | De Haes et al. | 430/204 |
| 3,728,114 | 4/1973 | Futaki et al. | 430/204 |
| 3,776,728 | 12/1973 | Suzuki et al. | 430/204 |
| 4,134,769 | 1/1979 | Yoshida et al. | 430/204 |
| 4,160,670 | 7/1979 | Tsubai et al. | 430/204 |
| 4,336,321 | 6/1982 | Kanada et al. | 430/234 |
| 4,501,811 | 2/1985 | Saikawa et al. | 430/204 |
| 4,510,228 | 4/1985 | Tsubai et al. | 430/204 |
| 4,621,041 | 11/1986 | Saikawa et al. | 430/204 |
| 4,948,699 | 8/1990 | Nishinoiri et al. | 430/204 |

*Primary Examiner*—Richard L. Schilling
*Attorney, Agent, or Firm*—Cushman, Darby & Cushman

[57] ABSTRACT

The present invention provides a lithographic printing plate material utilizing silver complex diffusion transfer process which can provide a lithographic printing plate markedly improved in water retentivity and prevented from deterioration of printability after storage. The lithographic printing plate material comprises a support and at least a silver halide emulsion layer and a physical development nuclei layer, wherein at least one of the physical development nuclei layer and a layer contiguous to the nuclei layer contains at least one water-soluble synthetic polymer selected from those which are represented by the following formulas:

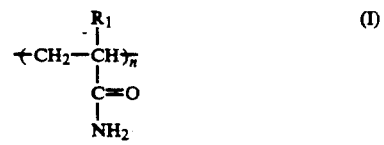

wherein $R_1$ represents H or an alkyl group and n represents 100–3500 and

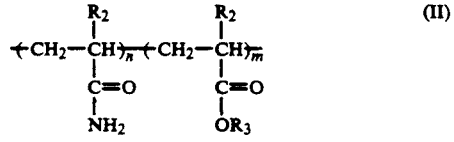

wherein $R_2$ represents H or an alkyl group, $R_3$ represents H or an alkali metal, the ratio of n:m is 10:0–1:9, and polymerization degree is 100–3500.

5 Claims, No Drawings

LITHOGRAPHIC PRINTING PLATE WITH POLYACRYLAMIDE POLYMER IN PHYSICAL DEVELOPMENT NUCLEI LAYER

BACKGROUND OF THE INVENTION

The present invention relates to lithographic printing plate materials to which silver complex diffusion transfer process is applied.

A lithographic printing plate relates to an oleophilic image portion which is receptive to oily inks and an oil-repellent non-image portion which is not receptive to inks. In general, said non-image portion comprises a hydrophilic portion receptive to water. In usual lithographic printing, both water and ink are provided on the surface of lithographic printing plate and the image portion selectively receives a coloring ink and the non-image portion selectively receives water and the printing is carried out by transferring ink on the image portion onto a material to be printed, such as paper.

Therefore, in order to make good prints, a great difference between the oleophilicity of the image portion and the hydrophilicity of the non-image portion is required and when water and an ink are provided on the surface of the printing plate, the image portion receives a sufficient amount of ink and the non-image portion does not completely receive the ink.

Lithographic printing plates made by silver complex diffusion transfer process, especially, lithographic printing plates having a physical development nuclei layer on a silver halide emulsion layer are disclosed, for example, in U.S. Pat. Nos. 3,728,114, 4,134,769, 4,160,670, 4,336,321, 4,501,811, 4,510,228 and 4,621,041. The exposed silver halide crystal undergoes chemical development by DTR development to become black silver which serves as a hydrophilic nonimage portion. On the other hand, unexposed silver halide crystal is converted to a silver complex by a silver salt complexing agent in the developer and the complex diffuses to the surface physical development nuclei layer and physical development occurs due to the presence of nuclei to form an image portion mainly composed of ink-receptive physically developed silver.

In this way, the above-mentioned lithographic printing plate utilizes a silver image precipitated on the physical development nuclei layer provided on a gelatin-silver halide emulsion layer as an ink-receptive image portion and has the defects that its resistance against mechanical abrasion is insufficient as compared with general lithographic printing plates (such as PS plate) and the image portion is torn off or the ink-receptivity of the image portion is gradually lost.

If hardness of gelatin is enhanced or amount of the physical development nuclei is increased in order to overcome these defects, background areas are stained resulting in much decrease of printing endurance. Furthermore, staining of background occurs or ink-receptivity deteriorates during storage of long period of from production of lithographic printing plate materials to making of printing plates and improvements of these defects have been desired.

SUMMARY OF THE INVENTION

An object of the present invention is to provide a lithographic printing plate material which is improved in water retention and uses silver complex diffusion transfer process.

Another object of the present invention is to provide a lithographic printing plate which is improved in storage stability of printability and uses silver complex diffusion transfer process.

The above objects have been attained by providing a lithographic printing plate material comprising a support and at least a silver halide emulsion layer and a physical development nuclei layer provided on the support wherein the physical development nuclei layer or/and a layer contiguous to the nuclei layer contain at least one water-soluble synthetic polymer selected from the polymers represented by the following formulas [I] and [II]:

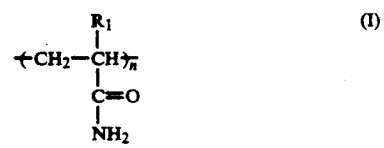

wherein $R_1$ represents H or an alkyl group, preferably a lower alkyl group and n is 100–3500.

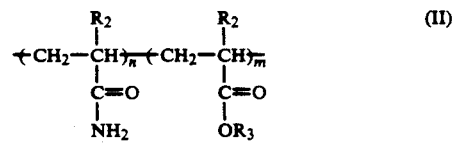

wherein $R_2$ represents H or an alkyl group, preferably a lower alkyl group, $R_3$ represents H or an alkali metal such as Na, K or the like, the ratio $n:m$ is 10:0–1:9 and polymerization degree is 100–3500.

DESCRIPTION OF THE INVENTION

Content of the polymer represented by the formulas [I] and [II] is preferably 300 mg/m² or less, more preferably 2–150 mg/m². The polymers can be contained in the constituting layer by any methods and is contained in the physical development nuclei layer or/and a layer contiguous thereto. The polymer can be applied before or after coating of physical development nuclei, but most advantageously it is applied together with physical development nuclei and from the points of stability of quality and easiness of preparation it is convenient to add the polymer in preparation of a coating solution.

Molecular weight of the polymer of the formula [I] and [II] is preferably 10,000–500,000, more preferably 100,000–300,000 from the points of fixation of the polymer (not escaping) during development, stability of coating solution of the polymer and coatability.

The polymers of the formulas [I] and [II] can be used in combination and besides can be used in combination with water-soluble polymers contained in the physical development nuclei layer mentioned hereinafter, such as carboxymethyl cellulose, gum arabic, sodium alginate and vinylimidazole-acrylamide copolymer, whereby effects obtained by the polymers of the formulas [I] and [II] can further be improved.

Use of other water-soluble polymers causes deterioration of ink-receptivity with increase of the amount of them while the polymers of the present invention cause little deterioration of ink-receptivity with increase of the amount thereof and can be used in larger amount than other polymers and the effects are naturally enhanced.

The lithographic printing plate material of the present invention contains gelatin and layers containing the gelatin can be an undercoat layer, an emulsion layer and a physical development nuclei layer. These gelatin-containing layers can be hardened with gelatin hardeners. The gelatin hardeners include, for example, inorganic compounds such as chromium alum, aldehydes such as formalin, glyoxal, malealdehyde and glutaraldehyde, N-methylol compounds such as urea and ethyleneurea, aldehydes such as mucochloric acid and 2,3-dihydroxy-1,4-dioxane, compounds having active halogen such as 2,4-dichloro-6-hydroxy-S-triazine salt and 2,4-dihydroxy-6-chloro-triazine salt, divinyl sulfone, divinyl ketone and N,N,N-triacryloylhexahydrotriazine, compounds having, in the molecule, two or more ethyleneimino groups or epoxy groups which are active 3-membered rings, and dialdehyde starch as a polymeric hardener. These compounds may be used singly or in combination of two or more.

The hardener can be added to all layers, some layers or only one layer. Of course, when two layers are simultaneously coated, a diffusible hardener can be added to only either one layer. The hardener can be added during preparation of emulsion or in line with coating of the layers.

The gelatin in the gelatin-containing layer of the present invention can be partially replaced with one or more of hydrophilic polymers such as water-soluble gelatin, starch, dextrin, albumin, sodium alginate, hydroxyethyl cellulose, gum arabic, polyvinyl alcohol, polyvinyl pyrrolidone, carboxymethyl cellulose, polyacrylamide, styrene-maleic anhydride copolymer and polyvinylmethyl ether-maleic anhydride copolymer. Moreover, vinyl polymer aqueous dispersion (latex) can be added to the gelatin-containing layer.

Amount of polymeric binder in the undercoat layer is generally 0.5–10 g/m$^2$, more preferably 1–6 g/m$^2$. The undercoat layer may contain pigments such as carbon black and dyes for the purpose of antihalation and may further contain solid powders (such as silica particles) of 2–10 microns in average particle size for improvement of printing endurance. Besides, it may contain photographic additives such as developing agent. The undercoat layer can be such one as disclosed in Japanese Patent Kokai (Laid-Open) Nos. 48-5503, 48-100203 and 49-16507.

The silver halide emulsion layer comprises, for example, silver chloride, silver bromide, silver chlorobromide and these silver halides containing silver iodide. Silver halide crystals may contain heavy metal salts such as rhodium salts, iridium salts, palladium salts, ruthenium salts, nickel salts and platinum salts and addition amount thereof is $10^{-8}$–$10^{-3}$ mol for 1 mol of silver halide. Crystal form of the silver halide has no special limitation and the crystal may be in the form of cubic or fourteenfaced polyhedron grains and besides may be in the form of core-shell or platy grains. The silver halide crystal may be monodispersed or polydispersed and average grain size thereof is 0.2–0.8 μm. One preferred example is monodispersed or polydispersed crystal comprising at least 80 mol % of silver chloride and containing a rhodium salt or iridium salt.

The silver halide emulsion can be sensitized in various ways during its preparation or coating. The emulsion is preferably sensitized chemically by the methods well known to the art by using, for example, sodium thiosulfate, alkylthioureas or gold compounds such as gold rhodanide and gold chloride or mixtures thereof.

The emulsion can also be positively or negatively sensitized with dyes such as cyanine or merocyanine or can be desensitized. The wavelength region to which the emulsion can be sensitized or desensitized has no special limitation. Therefore, the emulsion can be orthochromatically or panchromatically sensitized, or sensitized for exposure by helium-neon laser, argon laser, LED, or semiconductor laser or can be sensitized for UV or desensitized against visible light for use under roomlight.

The surface layer present over the emulsion layer contains physical development nuclei. The physical development nuclei include, for example, metal colloid fine particles such as silver, antimony, bismuth, cadmium, cobalt, lead, nickel, palladium, rhodium, gold and platinum, sulfides, polysulfides and selenides of these metals and mixtures and mixed crystals thereof. The physical development nuclei may not contain hydrophilic binders, but may contain, as hydrophilic binders, hydrophilic polymers such as gelatin, starch, dialdehyde starch, carboxymethyl cellulose, gum arabic, sodium alginate, hydroxyethyl cellulose, polystyrenesulfonic acid, vinyl imidazole-acrylamide copolymer, and polyvinyl alcohol or oligomers thereof. Content thereof is preferably 0.5 g/m$^2$ or less. The physical development nuclei layer may further contain developing agents such as hydroquinone, methylhydroquinone and catechol and known hardeners such as formalin and dichloro-S-triazine.

The coats such as undercoat layer, the silver halide emulsion layer and the physical development nuclei layer may contain some of anionic, cationic and neutral surface active agents and may further contain antifoggants, matting agents, thickeners, and antistatic agents.

The supports for lithographic printing plate of the present invention may be any of those which can stand lithographic printing such as paper, synthetic or semisynthetic polymer films, and metal sheets such as aluminum and iron. One or both sides of the support can be covered with one or more polymer films or metallic thin films. The surface of these supports can be subjected to surface treatment for enhancing adhesion to the coated layer.

Especially preferred supports are papers coated with polyolefin polymer on one or both sides, polyester films, polyester films the surface of which is subjected to hydrophilizing treatment, and surface treated aluminum sheets. These supports may contain pigments for the purpose of antihalation or solid fine particles for the purpose of improving surface properties. Moreover, the supports may be light transmissible so as to be able to be exposed from back side.

The processing solution used in the present invention may contain alkaline substances such as sodium hydroxide, potassium hydroxide, lithium hydroxide and trisodium phosphate; preservatives such as sulfites; silver halide solvents such as thiosulfates, thiocyanates, cyclic imides, 2-mercaptobenzoic acid and amines; thickeners such as hydroxyethyl cellulose and carboxymethyl cellulose; antifoggants such as potassium bromide and compounds disclosed in Japanese Patent Kokai (Laid-Open) No. 47-26201; developing agents such as hydroquinones, catechol and 1-phenyl-3-pyrazolidone, and development modifiers such as polyoxyalkylene compounds and onium compounds. Furthermore, the processing solution may contain compounds for improving ink-receptivity of the surface silver layer such as those which are mentioned in U.S. Pat. No. 3,776,728.

The surface silver layer of the lithographic printing plate after developed can be rendered ink-receptive or enhanced in its ink-receptivity by optional known surface treating agents. These treating agents are such as those which are described in Japanese Patent Kokoku No. 48-29723 and U.S. Pat. No. 3,721,559. Printing method and etch solution, dampening solution and the like may be those generally known to the art.

The present invention will be explained by the following nonlimiting examples.

EXAMPLE 1

A matting layer containing silica particles having an average particle size of 5μ was provided on one side of a both sides polyethylene coated paper of 135 g/m². On another side of said paper which had been subjected to corona discharge treatment were coated simultaneously an undercoat (gelatin 3.5 g/m²) containing carbon black and silica powders having an average particle size of 7μ and thereon an orthochromatically sensitized high sensitivity silver chloride emulsion (containing 0.8 g/m² of gelatin) containing 0.1 g/m² of 1-phenyl-3-pyrazolidone at a coating amount of 1.0 g/m² in terms of silver nitrate.

The undercoat layer contained 170 mg/m² of 2,4-dichloro-6-hydroxy-S-triazine sodium as a hardener and the emulsion layer contained 80 mg/m² of N-methylol ethyleneurea as a hardener. After drying, on the emulsion layer was coated a nuclei coating solution described in Example 2 of U.S. Pat. No. 4,160,670 (containing acrylamide-imidazole copolymer of No. 3 as a polymer and 0.8 g/m² of hydroquinone as a developing agent) and dried to obtain a lithographic printing plate material of Comparative Example A.

Lithographic printing plate materials C and D of the present invention were prepared in the same manner as in preparation of lithographic printing plate of Comparative Example A mentioned above except that 50 mg/m² of the compound of the following formula [I'] or [II'] was further added to the nuclei coating solution.

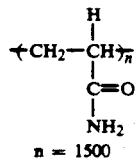

[I']

n = 1500

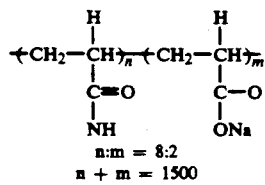

[II']

n:m = 8:2
n + m = 1500 wherein the polymerization degree is 1500.

Furthermore, a lithographic printing plate material of Comparative Example B was prepared in the same manner as in the lithographic printing plate material of Comparative Example A except that the nuclei coating solution contained 50 mg/m² of carboxymethyl cellulose. These four lithographic printing plate materials just after preparation and after stored for 5 days under the conditions of 50° C. and 80% RH were exposed imagewise in a process camera having an image reverse mechanism and subjected to development by the following silver complex diffusion transfer developer at 30° C. for 1 minute.

| <Transfer developer> | |
|---|---|
| Water | 700 ml |
| Potassium hydroxide | 20 g |
| Anhydrous sodium sulfite | 50 g |
| 2-Mercaptobenzoic acid | 1.5 g |
| 2-Methylaminoethanol | 15 g |
| Water to make up totally 1 liter | |

After the development, the material was passed between two squeeze rollers to remove excess developer, then immediately treated with the following neutralizing solution at 25° C. for 20 seconds, passed between squeeze rollers to remove excess solution and dried at room temperature.

| <Neutralizing solution> | |
|---|---|
| Water | 600 ml |
| Citric acid | 10 g |
| Sodium citrate | 35 g |
| Colloidal silica (20% solution) | 5 ml |
| Ethylene glycol | 5 ml |
| Water to make up totally 1 liter | |

The lithographic printing plate made by the above operation was mounted on an offset printing machine and the following etch solution was applied all over the plate surface and printing was carried out using the following dampening solution.

| <Etch solution> | |
|---|---|
| Water | 600 ml |
| Isopropyl alcohol | 400 ml |
| Ethylene glycol | 50 g |
| 3-Mercapto-4-acetamido-5-n-heptyl-1,2,4-triazole | 1 g |
| <Dampening solution> | |
| o-Phosphoric acid | 10 g |
| Nickel nitrate | 5 g |
| Sodium nitrite | 5 g |
| Ethylene glycol | 100 g |
| Colloidal silica (20% solution) | 28 g |
| Water to make up totally 2 liters | |

A.B.Dick 350 CD (Trademark for offset printing machine manufactured by A.B.Dick Co.) was used as the printing machine. Printing endurance was evaluated in terms of the number of copies obtained before the printing bad become impossible owing to the stain of non-image portion and the occurrence of disappearance of images caused by tearing off of the silver image portion and expressed by the following criteria.

| | Number of copies |
|---|---|
| ○ | 10,000–20,000 |
| △ | 5,000–10,000 |
| × | 2,000–5,000 |

The results are shown in Table 1.

Separately, water retentivity (staining) of non-image portion was evaluated in the following manner. Printing was carried out by A.B.Dick 350 CD using F Gloss Purple 68S manufactured by Dainippon Ink & Chemicals Inc. as an ink and water as a dampening solution and the water retentivity was evaluated in terms of the number of copies before the printing had become impossible owing to the occurrence of stain in the non-image portion and expressed by the following criteria.

| | Number of copies |
|---|---|
| o | More than 1000 |
| Δ | 300-1000 |
| x | 1-300 |

In the evaluation of printing endurance mentioned above, test on ink-receptivity of the plate was also conducted and the ink-receptivity was evaluated in terms of the number of papers fed before clear copies began to be produced. The results are also shown in Table 1.

TABLE 1

| | Printing endurance | | Water retentivity | | Ink receptivity | |
|---|---|---|---|---|---|---|
| | Just after preparation | After stored | Just after preparation | After stored | Just after preparation | After stored |
| Comparative plate A | o | o | Δ | x | 10 | 8 |
| Comparative plate B | Δ | Δ | Δ | x | 20 | 10 |
| The present plate C | o | o | o | o | 10 | 8 |
| The present plate D | o | o | o | o | 10 | 10 |

It can be seen from the above results that the printing plates made using the water-soluble synthetic polymers of the formula [I'] and [II'] of the present invention were excellent in various printing characteristics, especially water retentivity and besides in stability with time.

That is, according to the present invention, water retentivity of lithographic printing plates applied with silver complex diffusion transfer process can be improved and deterioration of printability during storage can be prevented.

We claim:

1. A lithographic printing plate material comprising a support and at least a silver halide emulsion layer and a physical development nuclei layer and utilizing silver complex diffusion transfer process, wherein the physical development nuclei layer contains at least one water-soluble synthetic polymer selected from those which are represented by the following formula:

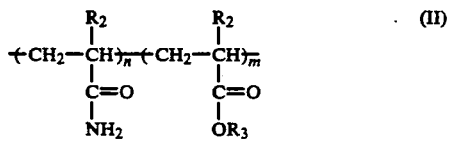

wherein $R_2$ represents H or an alkyl group, $R_3$ represents H or an alkali metal, the ratio of $n:m$ is 8:2-1:9, and polymerization degree is 100-3500.

2. A lithographic printing plate material according to claim 1, wherein content of the water-soluble synthetic polymer is 300 mg/m² or less.

3. A lithographic printing plate material according to claim 1, wherein molecular weight of the water-soluble synthetic polymer is 10,000-500,000.

4. A method for making a lithographic printing plate which comprises imagewise exposing the lithographic printing plate material of claim 1 and then developing it with a diffusion transfer developer.

5. A method of printing which comprises mounting the lithographic printing plate made by the method of claim 4 on an offset printing machine and carrying out printing with a dampening solution.

* * * * *